(12) United States Patent
Lubomirsky et al.

(10) Patent No.: US 8,524,004 B2
(45) Date of Patent: Sep. 3, 2013

(54) LOADLOCK BATCH OZONE CURE

(75) Inventors: Dmitry Lubomirsky, Cupertino, CA (US); Jay D. Pinson, II, San Jose, CA (US); Kirby H. Floyd, San Jose, CA (US); Adib Khan, Santa Clara, CA (US); Shankar Venkataraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 278 days.

(21) Appl. No.: 13/161,371

(22) Filed: Jun. 15, 2011

(65) Prior Publication Data

US 2012/0145079 A1 Jun. 14, 2012

Related U.S. Application Data

(60) Provisional application No. 61/355,527, filed on Jun. 16, 2010.

(51) Int. Cl.
*C23C 16/455* (2006.01)

(52) U.S. Cl.
USPC ........... 118/719; 118/715; 118/724; 118/725; 118/728; 118/729

(58) Field of Classification Search
USPC .................. 118/715, 719, 724, 725, 728, 729
See application file for complete search history.

(56) References Cited

U.S. PATENT DOCUMENTS

| | | | |
|---|---|---|---|
| 4,147,571 A | 4/1979 | Stringfellow et al. | |
| 4,816,098 A | 3/1989 | Davis et al. | |
| 4,818,326 A | 4/1989 | Liu et al. | |
| 4,931,354 A | 6/1990 | Wakino et al. | |
| 5,016,332 A | 5/1991 | Reichelderfer et al. | |
| 5,110,407 A | 5/1992 | Ono et al. | |
| 5,271,972 A | 12/1993 | Kwok et al. | |
| 5,393,708 A | 2/1995 | Hsia et al. | |
| 5,426,076 A | 6/1995 | Moghadam | |

(Continued)

FOREIGN PATENT DOCUMENTS

| DE | 19654737 A1 | 7/1997 |
|---|---|---|
| EP | 0892083 A1 | 1/1999 |

(Continued)

OTHER PUBLICATIONS

Aylett, B. J. et al., "Silicon-Nitrogen Compounds. Part V. Diphenylamino-derivatives of Silane," J. Chem. Soc. (A), 1969, pp. 636-638.

(Continued)

*Primary Examiner* — Jeffrie R Lund
*Assistant Examiner* — Satish Chandra
(74) *Attorney, Agent, or Firm* — Kilpatrick Townsend & Stockton LLP

(57) ABSTRACT

A substrate processing chamber for processing a plurality of wafers in batch mode. In one embodiment the chamber includes a vertically aligned housing having first and second processing areas separated by an internal divider, the first processing area positioned directly over the second processing area; a multi-zone heater operatively coupled to the housing to heat the first and second processing areas independent of each other; a wafer transport adapted to hold a plurality of wafers within the processing chamber and move vertically between the first and second processing areas; a gas distribution system adapted to introduce ozone into the second area and steam into the first processing area; and a gas exhaust system configured to exhaust gases introduced into the first and second processing areas.

10 Claims, 3 Drawing Sheets

(56) References Cited

U.S. PATENT DOCUMENTS

| | | |
|---|---|---|
| 5,558,717 A | 9/1996 | Zhao et al. |
| 5,587,014 A | 12/1996 | Leychika et al. |
| 5,622,784 A | 4/1997 | Okaue et al. |
| 5,635,409 A | 6/1997 | Moslehi |
| 5,665,643 A | 9/1997 | Shin |
| 5,691,009 A | 11/1997 | Sandhu |
| 5,786,263 A | 7/1998 | Perera |
| 5,853,607 A | 12/1998 | Zhao et al. |
| 5,935,340 A | 8/1999 | Xia et al. |
| 5,937,308 A | 8/1999 | Gardner et al. |
| 5,937,323 A | 8/1999 | Orczyk et al. |
| 6,008,515 A | 12/1999 | Hsia et al. |
| 6,009,830 A | 1/2000 | Li et al. |
| 6,024,044 A | 2/2000 | Law et al. |
| 6,087,243 A | 7/2000 | Wang |
| 6,090,723 A | 7/2000 | Thakur et al. |
| 6,114,219 A | 9/2000 | Spikes et al. |
| 6,140,242 A | 10/2000 | Oh et al. |
| 6,146,970 A | 11/2000 | Witek et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,207,587 B1 | 3/2001 | Li et al. |
| 6,287,962 B1 | 9/2001 | Lin |
| 6,302,964 B1 | 10/2001 | Umotoy et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,448,187 B2 | 9/2002 | Yau et al. |
| 6,503,557 B1 | 1/2003 | Joret |
| 6,506,253 B2 | 1/2003 | Sakuma |
| 6,508,879 B1 | 1/2003 | Hashimoto |
| 6,509,283 B1 | 1/2003 | Thomas |
| 6,524,931 B1 | 2/2003 | Perera |
| 6,528,332 B2 | 3/2003 | Mahanpour et al. |
| 6,544,900 B2 | 4/2003 | Raaijmakers et al. |
| 6,548,416 B2 | 4/2003 | Han et al. |
| 6,548,899 B2 | 4/2003 | Ross |
| 6,559,026 B1 | 5/2003 | Rossman et al. |
| 6,566,278 B1 | 5/2003 | Harvey et al. |
| 6,589,868 B2 | 7/2003 | Rossman |
| 6,596,654 B1 | 7/2003 | Bayman et al. |
| 6,602,806 B1 | 8/2003 | Xia et al. |
| 6,614,181 B1 | 9/2003 | Harvey et al. |
| 6,624,064 B1 | 9/2003 | Sahin et al. |
| 6,630,413 B2 | 10/2003 | Todd |
| 6,645,303 B2 | 11/2003 | Frankel et al. |
| 6,660,391 B1 | 12/2003 | Rose et al. |
| 6,676,751 B2 | 1/2004 | Solomon et al. |
| 6,683,364 B2 | 1/2004 | Oh et al. |
| 6,716,770 B2 | 4/2004 | O'Neill et al. |
| 6,756,085 B2 | 6/2004 | Waldfried et al. |
| 6,762,126 B2 | 7/2004 | Cho et al. |
| 6,787,191 B2 | 9/2004 | Hanahata et al. |
| 6,794,290 B1 | 9/2004 | Papasouliotis et al. |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,835,278 B2 | 12/2004 | Selbrede et al. |
| 6,858,523 B2 | 2/2005 | Deboer et al. |
| 6,867,086 B1 | 3/2005 | Chen et al. |
| 6,872,323 B1 | 3/2005 | Entley et al. |
| 6,890,403 B2 | 5/2005 | Cheung |
| 6,900,067 B2 | 5/2005 | Kobayashi et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,084,076 B2 | 8/2006 | Park et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,176,144 B1 | 2/2007 | Wang et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,335,609 B2 | 2/2008 | Ingle et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,498,273 B2 | 3/2009 | Mallick et al. |
| 7,524,735 B1 | 4/2009 | Gauri et al. |
| 7,524,750 B2 | 4/2009 | Nemani et al. |
| 7,541,297 B2 | 6/2009 | Mallick et al. |
| 7,745,352 B2 | 6/2010 | Mallick et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,935,643 B2 | 5/2011 | Liang et al. |
| 7,943,531 B2 | 5/2011 | Nemani et al. |
| 7,989,365 B2 | 8/2011 | Park et al. |
| 7,994,019 B1 | 8/2011 | Kweskin et al. |
| 2001/0021595 A1 | 9/2001 | Jang et al. |
| 2001/0029114 A1 | 10/2001 | Vulpio et al. |
| 2001/0038919 A1 | 11/2001 | Berry et al. |
| 2001/0054387 A1 | 12/2001 | Frankel et al. |
| 2002/0048969 A1 | 4/2002 | Suzuki et al. |
| 2002/0081817 A1 | 6/2002 | Bhakta et al. |
| 2002/0127350 A1 | 9/2002 | Ishikawa et al. |
| 2002/0142585 A1 | 10/2002 | Mandal |
| 2002/0146879 A1 | 10/2002 | Fu et al. |
| 2002/0164891 A1 | 11/2002 | Gates et al. |
| 2003/0040199 A1 | 2/2003 | Agarwal |
| 2003/0064154 A1 | 4/2003 | Laxman et al. |
| 2003/0118748 A1 | 6/2003 | Kumagai et al. |
| 2003/0124873 A1 | 7/2003 | Xing et al. |
| 2003/0143841 A1 | 7/2003 | Yang et al. |
| 2003/0159656 A1 | 8/2003 | Tan et al. |
| 2003/0172872 A1 | 9/2003 | Thakur et al. |
| 2003/0199151 A1 | 10/2003 | Ho et al. |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0048492 A1 | 3/2004 | Ishikawa et al. |
| 2004/0065253 A1 | 4/2004 | Pois et al. |
| 2004/0079118 A1 | 4/2004 | M'Saad et al. |
| 2004/0146661 A1 | 7/2004 | Kapoor et al. |
| 2004/0152342 A1 | 8/2004 | Li et al. |
| 2004/0161899 A1 | 8/2004 | Luo et al. |
| 2004/0175501 A1 | 9/2004 | Lukas et al. |
| 2004/0180557 A1 | 9/2004 | Park et al. |
| 2004/0185641 A1 | 9/2004 | Tanabe et al. |
| 2004/0219780 A1 | 11/2004 | Ohuchi |
| 2004/0231590 A1 | 11/2004 | Ovshinsky |
| 2004/0241342 A1 | 12/2004 | Karim et al. |
| 2005/0001556 A1 | 1/2005 | Hoffman et al. |
| 2005/0019494 A1 | 1/2005 | Moghadam et al. |
| 2005/0026443 A1 | 2/2005 | Goo et al. |
| 2005/0062165 A1 | 3/2005 | Saenger et al. |
| 2005/0087140 A1 | 4/2005 | Yuda et al. |
| 2005/0118794 A1 | 6/2005 | Babayan et al. |
| 2005/0142895 A1 | 6/2005 | Ingle et al. |
| 2005/0153574 A1 | 7/2005 | Mandal |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0227499 A1 | 10/2005 | Park et al. |
| 2005/0250340 A1 | 11/2005 | Chen et al. |
| 2005/0260347 A1 | 11/2005 | Narwankar et al. |
| 2006/0011984 A1 | 1/2006 | Curie |
| 2006/0014399 A1 | 1/2006 | Joe |
| 2006/0030165 A1 | 2/2006 | Ingle et al. |
| 2006/0046506 A1 | 3/2006 | Fukiage |

| | | | |
|---|---|---|---|
| 2006/0055004 | A1 | 3/2006 | Gates et al. |
| 2006/0068599 | A1 | 3/2006 | Baek et al. |
| 2006/0075966 | A1 | 4/2006 | Chen et al. |
| 2006/0096540 | A1 | 5/2006 | Choi |
| 2006/0110943 | A1 | 5/2006 | Swerts et al. |
| 2006/0121394 | A1 | 6/2006 | Chi |
| 2006/0162661 | A1 | 7/2006 | Jung et al. |
| 2006/0178018 | A1 | 8/2006 | Olsen |
| 2006/0223315 | A1 | 10/2006 | Yokota et al. |
| 2006/0228903 | A1 | 10/2006 | McSwiney et al. |
| 2006/0252240 | A1 | 11/2006 | Gschwandtner et al. |
| 2006/0281496 | A1 | 12/2006 | Cedraeus |
| 2006/0286776 | A1 | 12/2006 | Ranish et al. |
| 2007/0020392 | A1 | 1/2007 | Kobrin et al. |
| 2007/0026689 | A1 | 2/2007 | Nakata et al. |
| 2007/0031598 | A1 | 2/2007 | Okuyama et al. |
| 2007/0049044 | A1 | 3/2007 | Marsh |
| 2007/0077777 | A1 | 4/2007 | Gumpher |
| 2007/0092661 | A1 | 4/2007 | Ryuzaki et al. |
| 2007/0128864 | A1 | 6/2007 | Ma et al. |
| 2007/0134433 | A1 | 6/2007 | Dussarrat et al. |
| 2007/0166892 | A1 | 7/2007 | Hori |
| 2007/0173073 | A1 | 7/2007 | Weber |
| 2007/0181966 | A1 | 8/2007 | Watatani et al. |
| 2007/0232071 | A1 | 10/2007 | Balseanu et al. |
| 2007/0232082 | A1 | 10/2007 | Balseanu et al. |
| 2007/0275569 | A1 | 11/2007 | Moghadam et al. |
| 2007/0281495 | A1 | 12/2007 | Mallick et al. |
| 2007/0281496 | A1 | 12/2007 | Ingle et al. |
| 2008/0000423 | A1 | 1/2008 | Fukiage |
| 2008/0085607 | A1 | 4/2008 | Yu et al. |
| 2008/0102223 | A1 | 5/2008 | Wagner et al. |
| 2008/0102650 | A1 | 5/2008 | Adams et al. |
| 2008/0188087 | A1 | 8/2008 | Chen et al. |
| 2008/0206954 | A1 | 8/2008 | Choi et al. |
| 2008/0260969 | A1 | 10/2008 | Dussarrat et al. |
| 2008/0318429 | A1 | 12/2008 | Ozawa et al. |
| 2009/0035917 | A1 | 2/2009 | Ahn et al. |
| 2009/0053901 | A1 | 2/2009 | Goto et al. |
| 2009/0061647 | A1 | 3/2009 | Mallick et al. |
| 2009/0104755 | A1 | 4/2009 | Mallick et al. |
| 2009/0104790 | A1 | 4/2009 | Liang |
| 2009/0203225 | A1 | 8/2009 | Gates et al. |
| 2009/0325391 | A1 | 12/2009 | De Vusser et al. |
| 2010/0221925 | A1 | 9/2010 | Lee et al. |
| 2011/0014798 | A1 | 1/2011 | Mallick et al. |
| 2011/0034035 | A1 | 2/2011 | Liang et al. |
| 2011/0034039 | A1 | 2/2011 | Liang et al. |
| 2011/0045676 | A1 | 2/2011 | Park et al. |
| 2011/0111137 | A1 | 5/2011 | Liang et al. |
| 2011/0129616 | A1 | 6/2011 | Ingle et al. |
| 2011/0136347 | A1 | 6/2011 | Kovarsky et al. |

FOREIGN PATENT DOCUMENTS

| | | |
|---|---|---|
| EP | 1717848 A | 11/2006 |
| JP | 01241826 A | 9/1989 |
| KR | 10-2004-0091978 A | 11/2004 |
| KR | 10-2005-0003758 A | 1/2005 |
| KR | 10-2005-0094183 A | 9/2005 |
| WO | WO 02/077320 A1 | 10/2002 |
| WO | WO 03/066933 | 8/2003 |
| WO | WO 2005/078784 A | 8/2005 |
| WO | WO 2007/040856 A2 | 4/2007 |
| WO | WO 2007/140376 A | 12/2007 |
| WO | WO 2007/140424 A | 12/2007 |

OTHER PUBLICATIONS

Aylett, B. J. et al., "Silicon-Nitrogen Compounds. Part VI. The Preparation and Properties of Disilazane," J. Chem. Soc. (A), 1969, pp. 639-642.

Aylett, B. J. et al., "The Preparation and Some Properties of Disilyiamine-Correspondence," Inorganic Chemistry, 1966, p. 167.

Beach, David B., "Infrared and Mass Spectroscopic Study of the Reaction of Silyl Iodide and Ammonia. Infrared Spectrum to Silylamine," Inorganic Chemistry, 1992, pp. 4174-4177, vol. 31 No. 20.

Burg, Anton B. et at "Silyl-Amino Boron Compounds," J. Amer. Chem. Soc., Jul. 1950, pp. 3103- 3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilyiamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Gulleri, G. et al., "Deposition Temperature Determination of HDPCVD Silicon Dioxide Films," 2005, Microelectronic Engineering, vol. 82, pp. 236-241.

Kang, Hun, "A Study of the Nucleation and Formation of Multi-functional Nanostructures using GaN-Based Materials for Device Applications," Georgia Institute of Technology, Doctor of Philosophy in the School of Electrical & Computer Engineering Dissertation, Dec., 2006, p. 14.

Lee, Eun Gu, et at "Effects of Wet Oxidation on the Electrical Properties of sub-10 nm thick silicon nitride films", Thin Solid Films, Elsevier-Sequoia S.A. Lausanne, Ch. vol. 205, No. 2, Dec. 1, 1991, pp. 246-251.

Lucovsky, G. et al., "Deposition of silicon dioxide and silicon nitride by remote plasma enhanced chemical vapor deposition," Journal of Vacuum Science & Technology, vol. 4, No. 3, May-Jun. 1986, pp. 681-688.

Norman, Arlan D. et al., "Reaction of Silylphosphine with Ammonia," Inoragnic Chemistry, 1979, pp. 1594-1597, vol. 18 No. 6.

Sujishi, Sei et al., "Effect of Replacement of Carbon by Silicon in Trimethylamine on the Stabilities of the Trimethylboron Addition Compounds. Estimation of the Resonance Energy for Silicon-Nitrogen Partial Double Bond," Amer. Chem. Soc., Sep. 20, 1954, pp. 4631-4636, vol. 76.

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY.; US, vol. 4, No. 3, Part 01, May 1, 1986, pp. 480-485.

Ward, L. G. L. et al., "The Preparation and Properties of *Bis*-Disilanyl Sulphide and *Tris*-Disilanylamine," J. Inorg. Nucl. Chem., 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, 1998, 5 pages, vol. 7, VCH Publishers, Inc., New York.

LOADLOCK BATCH OZONE CURE

CROSS-REFERENCES TO RELATED APPLICATIONS

This application claims the benefit of U.S. Provisional Patent Application No. 61/355,527, filed Jun. 16, 2010, which is incorporated herein by reference for all purposes.

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The decreasing feature sizes result in structural features on the device having decreased spatial dimensions. The reduced dimensions, in turn, require the use of conductive materials having a very low resistivity and insulation materials having a very low dielectric constant.

Low dielectric constant films are particularly desirable for premetal dielectric (PMD) layers and intermetal dielectric (IMD) layers to reduce the RC time delay of the interconnect metalization, to prevent cross-talk between the different levels of metalization, and to reduce device power consumption. Undoped silicon oxide films deposited using early CVD techniques typically had a dielectric constant (k) in the range of 4.0 to 4.2. In contrast, various carbon-based dielectric layers that are now commonly used in the semiconductor industry have dielectric constants below 3.0. Many of these carbon-based layers are relatively unstable when initially deposited and are subsequently cured in an oxygen environment and/or annealed to increase the films stability.

BRIEF SUMMARY OF THE INVENTION

Embodiments of the present invention pertain to a chamber adapted to simultaneously cure a batch of wafers. The chamber includes first and second batch processing areas that are each serviced by a wafer transport that supports a plurality of substrates, each positioned on dedicated wafer supports arranged in a parallel stack. In one embodiment the first batch processing area is directly below the second batch processing area and the wafer transport is operatively coupled to a rotating pedestal that raises and lowers the transport between the first and second processing areas.

While a variety of different processing operations can be performed in the first and second batch processing areas, some embodiments of the invention allow for a high temperature (e.g., 100-200 degrees Celsius), pressurized (e.g., 200-700 Torr) ozone cure process in the second batch processing area and a $N_2O$ steam anneal process in the first batch processing area. Additionally, the first batch processing area is used for loading and unloading wafers into the chamber.

In one embodiment, the invention pertains to a chamber for processing a plurality of wafers in batch mode. The chamber includes a vertically aligned housing having first and second processing areas separated by an internal divider, the first processing area positioned directly over the second processing area; a multi-zone heater operatively coupled to the housing to heat the first and second processing areas independent of each other; a wafer transport adapted to hold a plurality of wafers within the processing chamber and move vertically between the first and second processing areas; a gas distribution system adapted to introduce ozone into the second area and steam into the first processing area; and a gas exhaust system configured to exhaust gases introduced into the first and second processing areas.

In another embodiment, a substrate curing chamber for processing a plurality of wafers in batch mode is provided that includes a vertically aligned housing having first and second processing areas separated by an internal divider, the first processing area positioned directly over the second processing area; a multi-zone heater operatively coupled to the housing to heat the first and second processing areas independent of each other; a wafer transport adapted to hold a plurality of wafers within either the first or second processing area for processing; a first gas distribution system adapted to introduce a process gas through the first processing area and a second gas distribution system adapted to introduce a process gas through the second processing area; a gas exhaust system configured to exhaust process gases introduced into the first and second processing areas; a pedestal, operatively coupled to the wafer transport, to move the wafer transport into an upper position in which the plurality of wafers are positioned in the second processing area and a lower position in which the plurality of wafers are positioned in the first processing area; and an access door that can be moved between an open position in which wafers can be loaded onto and removed from the wafer transport and a closed sealed position.

Additional embodiments and features are set forth in part in the description that follows, and in part will become apparent to those skilled in the art upon examination of the specification or may be learned by the practice of the invention. Additionally, a further understanding of the nature and advantages of the present invention may be realized by reference to the remaining portions of the specification and the drawings wherein like reference numerals are used throughout the several drawings to refer to similar components.

DETAILED DESCRIPTION OF THE INVENTION

Figure 1:
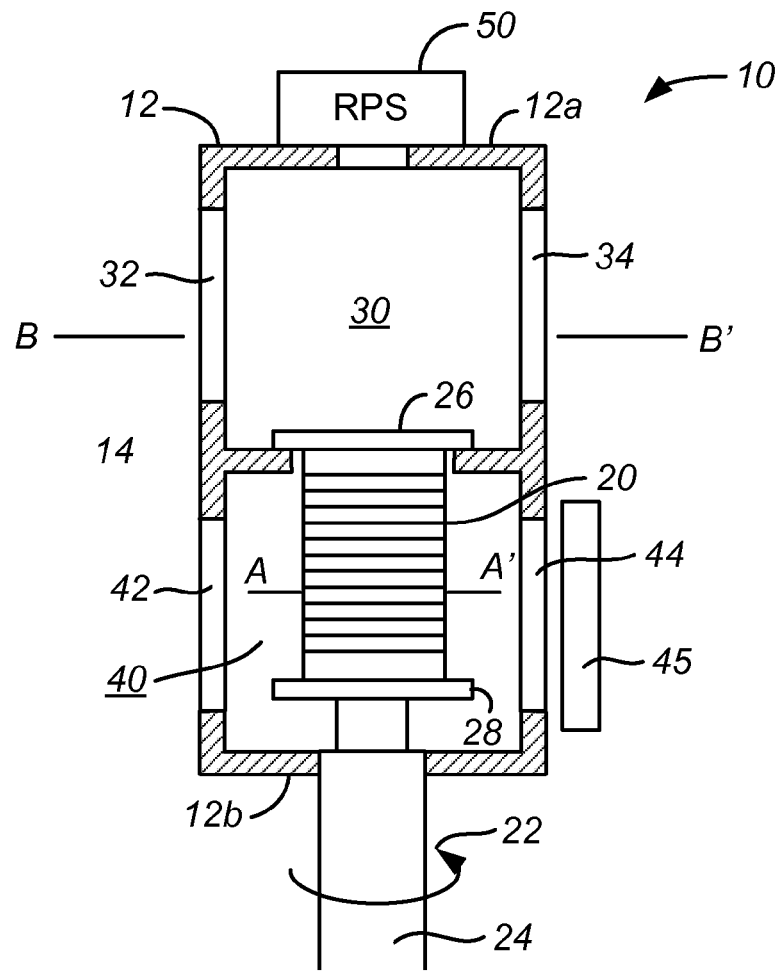
FIG. 1 is a simplified cross-sectional view of a curing chamber according to one embodiment of the invention.

FIG. 1 is a simplified cross-sectional view of a curing chamber 10 according to one embodiment of the invention. Chamber 10 is vertically-oriented and includes first and second batch processing areas 30 and 40 as described herein. Wafers are delivered to each of the batch processing areas 30 and 40 by a wafer transport 20 that holds a plurality of wafers (i.e., the batch of wafers) within it. In one embodiment wafer transport is mounted on a rotating pedestal 22 that allows the batch of wafers to be rotated within processing areas 30 and 40 during substrate processing operations.

Pedestal 22 is further operatively coupled to a vertical actuator 24 that lifts and withdraws wafer transport 20 into and out of processing area 40 as described below. A slit valve 45 allows a robot (not shown) that is coupled to an indexer (also not shown) to load and unload individual wafers from wafer transport 20 when it is positioned within area 40. To load wafers into transport 20, the indexer raises or lowers the robot to a desired position and the robot then extends through slit valve 45 and places an individual wafer on a wafer support within transport 20. In one embodiment wafers are loaded (and unloaded) one wafer at a time onto empty wafer supports within wafer transport 20 until the transport is full. In another embodiment, the robot includes a plurality of separate arms, each holding a wafer, and can load (and unload) multiple wafers into transport 20 at a time.

Chamber 10 includes an outer wall 12 that encloses processing areas 30 and 40 and an interior divider 14 that marks a separation boundary between processing areas 30 and 40. Divider 14 has an interior gap that allows wafer transport 20 to be raised and lowered past the divider. As will be discussed later, when a top portion or bottom portion of wafer transport 20 aligns with divider 14, a pseudo seal is created that inhibits but does not completely prevent the flow of gases from area 30 to area 40 and vice versa. In one embodiment, a pressure equalization line (not shown) extends between the first and second batch processing areas to avoid large forces that might otherwise be induced on the wafer transport due to pressure gradients that might be created as it is moved by vertical actuator 24 from one processing region to the other.

Gases can be introduced into batch processing area 30 through a gas plenum 32 and exhausted from batch processing area 30 through an exhaust plenum 34. Similarly, gases can be introduced into batch processing area 40 through a gas plenum 42 and exhausted from batch processing area 40 through an exhaust plenum 44. Each of the gas plenums 32 and 42 include multiple gas inlets both horizontally and vertically along the interior surface of chamber 10 as discussed below. Similarly, each of the exhaust plenums 34 and 44 include multiple exhaust outlets arranged both horizontally and vertically along the opposing interior surface of chamber 10. In one embodiment, batch processing area 30 is particularly adapted for a batch ozone cure operation and sources of ozone ($O_3$), oxygen ($O_2$) and nitrogen ($N_2$) are coupled to gas plenum 32, while batch processing area 40 is particularly adapted to a steam anneal operation and sources of molecular nitrogen ($N_2$), oxygen ($O_2$) and steam ($H_2O$) are coupled to gas plenum 42.

A vacuum pump and sealed nature of chamber 10 enables vacuum processing within each of areas 30 and 40 at desired pressures selected based upon the substrate processing operation performed in each area. As particular examples, in one embodiment the vacuum pump evacuates the chamber to about 600 Torr for an ozone cure and between 1-5 Torr for a chamber clean step.

Additionally, a remote plasma system 50 can be mounted to an upper surface of chamber 10 and operatively coupled to one or more sources of cleaning gases (e.g., nitrogen trifluoride). The remote plasma system can be fluidly coupled to processing areas 30 and 40 in order to introduce activated cleaning species into each of processing areas 30 and 40 during a chamber cleaning operation to remove particles that may deposit on the interior surfaces of chamber 10 during processing. The chamber cleaning operation may occur, for example, at regular intervals after one or many batch curing steps and/or batch annealing steps in chambers 30 and 40, respectively. In one embodiment, during a clean step, a plasma of argon and $NF_3$ is formed within remote plasma system 50 and activated clean species may flow directly into processing area 30 from the remote plasma system. Additional cleaning gases (e.g., more $NF_3$) may also be introduced into area 30 by gas lines within gas plenum 32.

A heater (not shown) is operatively coupled to heat chamber 10 for curing and annealing operations (and for clean operations if desired). The heater includes at least first and second independently controlled heating zones that allow the temperature within processing area 30 to be set to a different temperature than that of processing area 40. Independent temperature sensors (not shown) are positioned to sense the temperature within each of processing areas 30 and 40 and can be used by a computer control system (not shown) to independently adjust the temperature of each of areas 30 and 40 as needed. In one embodiment, the heater includes a cylindrical band heater coupled to outer wall 12 along with heating elements coupled to top wall 12a and bottom wall 12b of the chamber. Other types of heaters can be used in other embodiments as would be understood by a person of ordinary skill in the art. Also, a thermal blanket may be wrapped around chamber 10 and its heating elements to minimize heat loss in some embodiments.

Additionally, some embodiments of the invention provide a dedicated gas line at the bottom portion of processing area 30 and/or at the bottom of processing area 40 that can be used to provide heated nitrogen ($N_2$) to those processing areas to compensate for differences in temperature directly below the areas. As an example, in some instances, processing operations that are implemented in processing area 40 may occur at a temperature that is 100 degrees Celsius or more higher than the temperature that a processing operation implemented in area 30 is set to. Even though divider 14 and plates 26 and 28 provide thermal insulation between the two processing areas, to better compensate for this temperature difference, a plurality of dedicated gas inlets are located around the inner periphery of chamber 10 directly above divider 14. Gas may be heated and introduced through these inlets to provide additional heat in this area of the chamber when wafers are being processed in region 30 at a temperature higher than that of region 40. Alternatively, gas at room temperature or cooled may be introduced through these inlets to provide additional cooling in this area of the chamber when wafers are being processed in region 40 at a temperature lower than that of region 30. In another embodiment, the gas inlets can be located within either or both of plates 26 and 28.

Figure 2:
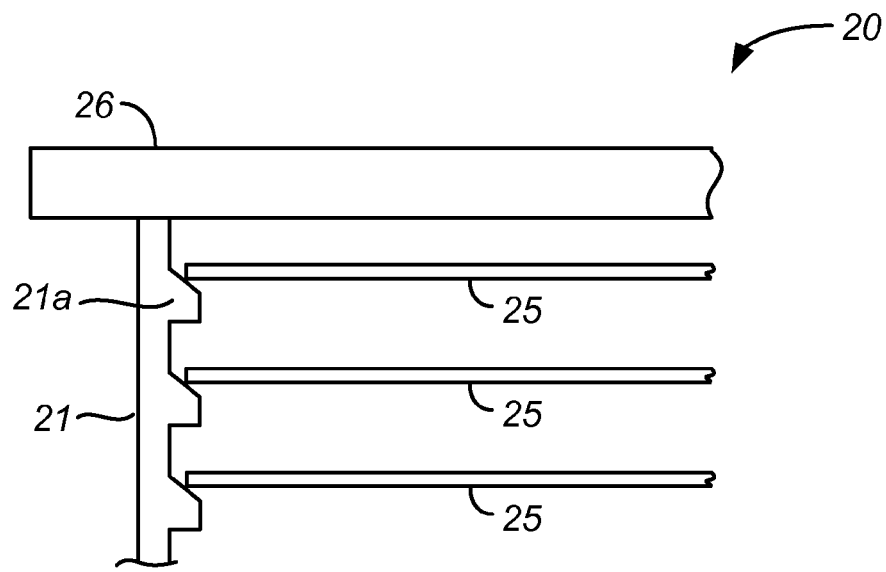
FIG. 2 is a simplified cross-sectional view of wafer transport 20 and pedestal 22 shown in FIG. 1.
Figure 3:
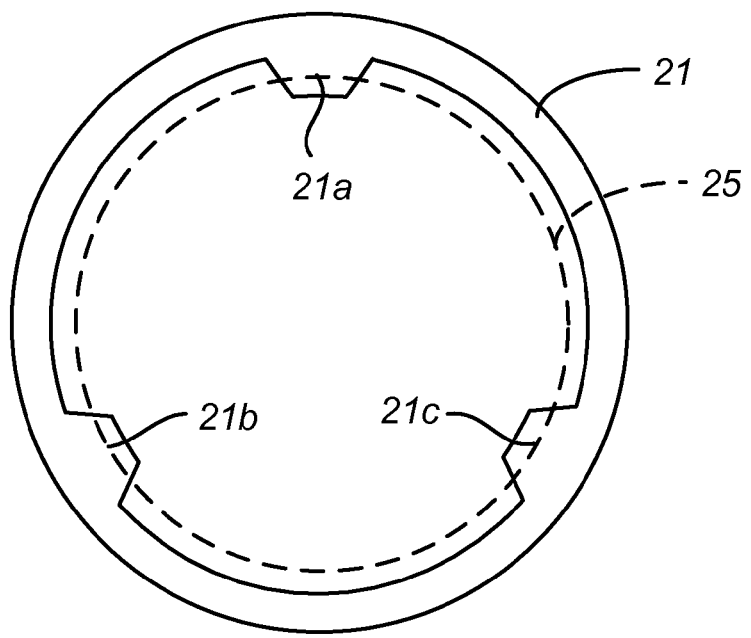
FIG. 3 is a simplified cross-sectional view of wafer transport 20 taken along lines A-A' shown FIG. 1.

Referring to FIG. 2, which is a simplified cross-sectional view of an upper portion of wafer transport 20 mounted, a plurality of semiconductor wafers 25 can be positioned within the wafer transport. Each individual wafer 25 is generally circular (e.g., a silicon semiconductor wafer) and is supported by a dedicated minimal-contact wafer support 21. In one embodiment, wafer support 21 includes three support ledges 21a, 21b and 21c that support each wafer that can be held within transport 20 near its outer edge. The support ledges 21a-21c are evenly spaced around the periphery the wafer transport 20 as shown in FIG. 3. In one particular embodiment, wafer transport 20 holds thirty wafers and thus has thirty sets of wafer supports ledges 21a-21c.

Wafer transport 20 further includes an upper thermal isolation plate 26 and a lower thermal isolation plate 28. Each of the thermal isolation plates 26 and 28 have a diameter that is slightly larger than that of wafers positioned within the transport. FIG. 1 shows wafer transport 20 in a lower position in which wafers can be loaded and unloaded from the transport and in which, once a complete batch of wafers is positioned in the transport, can be processed within lower processing area 40. As shown in FIG. 1, in this lower position, a lower surface of upper thermal isolation plate 26 comes is in contact with divider 14 to generally isolate the environment within lower processing area 40 from upper processing area 30 while the wafers 25 are being processed within area 40.

Similarly, when wafer transport 20 is raised by pedestal 22 and vertical actuator to the position for processing the wafers 25 in upper processing area 30, an upper surface of lower thermal isolation plate 28 comes in contact with divider 14 to generally isolate the environment within upper processing area 30 from lower processing area 40. Furthermore, each of the isolation plates 26 and 28 can be made from a material with low thermal conductivity (e.g., a thermal plastic material or stainless steel) to thermally isolate the wafers 25 from the heaters in the top and bottom surfaces 12a and 12b of the chamber wall. Dividers 14 are also made from a similar low thermal conductivity material. Thus, the combination of dividers 14 and either upper or lower thermal isolation plate 26, 28 helps to thermally isolate processing areas 30 and 40 so they can be maintained at different operational temperatures.

Figure 4:
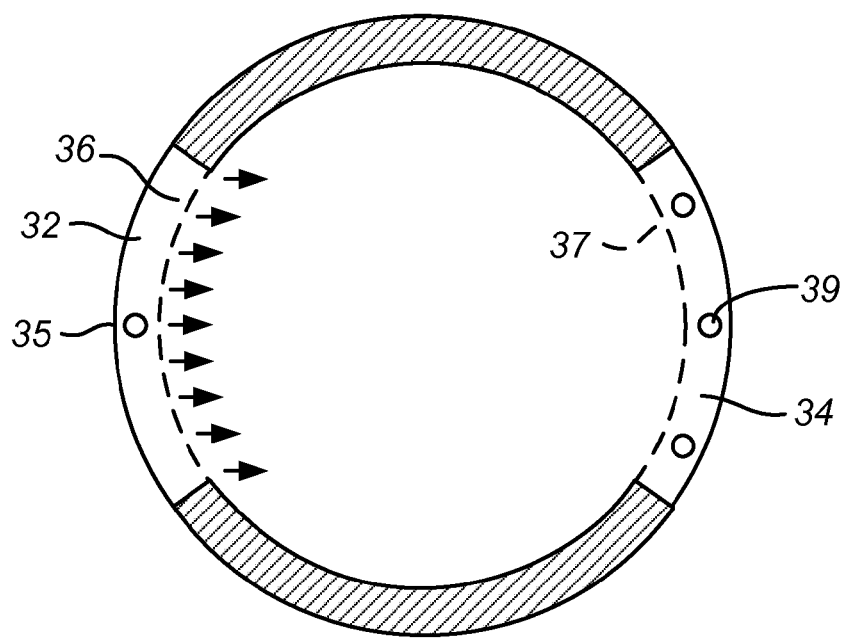
FIG. 4 is a simplified cross-sectional view of curing chamber 10 taken along lines B-B' shown in FIG. 1.
Figure 5:
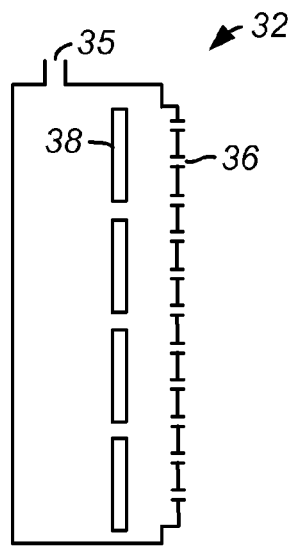
FIG. 5 is a simplified cross sectional view of gas plenum 32 shown in FIG. 1 according to one embodiment of the invention.
Figure 6:
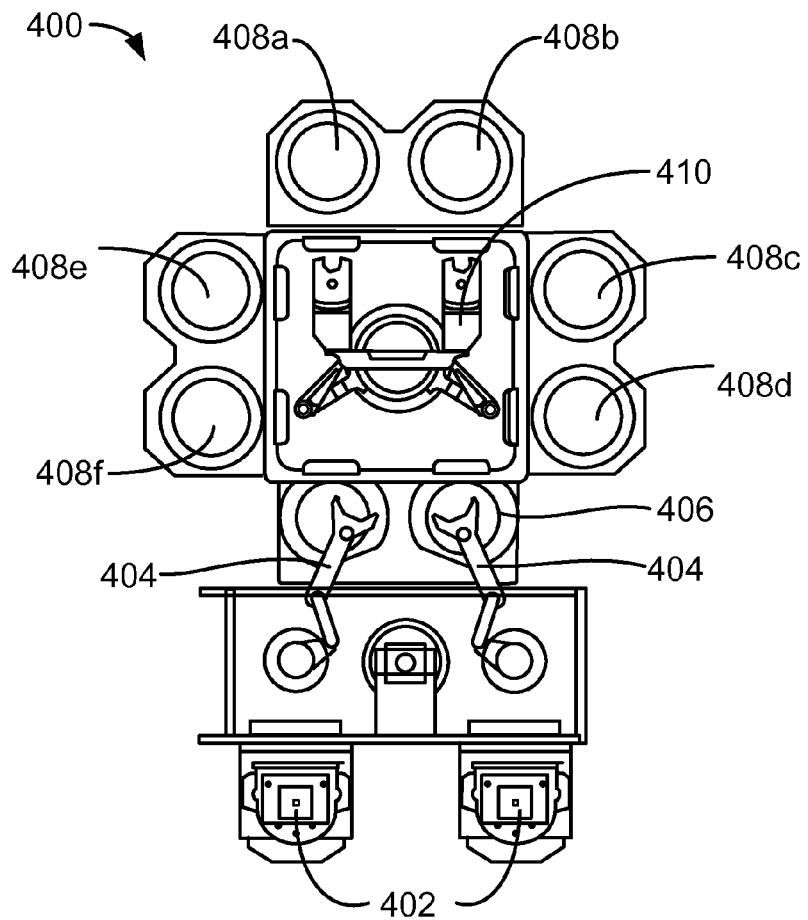
FIG. 6 is an simplified, illustrative view of an exemplary multi-chamber substrate processing system that includes a batch curing chamber according to the present invention.

Referring to FIG. 4, which is a simplified cross-sectional view of curing chamber 10 taken along lines B-B' shown in FIG. 1, and FIG. 5, which is a simplified cross-sectional view of gas plenum 32, gas enters plenum 32 through an inlet 35 and is circulated into processing area 30 via a plurality of gas inlets 36 formed in an interior wall of the chamber. In one embodiment, a liner 38 helps equalize pressure at all points of the plenum to gas flow is evenly introduced into processing area 30 at all inlets 36. Opposite gas plenum 32, a plurality of gas exhausts 37 are formed in the interior wall of exhaust plenum 34 and gas outlets 39 are used to exhaust gases from chamber 10 into a vacuum foreline. A similar gas distribution arrangement is formed for gas plenum 42 and exhaust plenum 44. The oppositional relationship between the gas plenum and exhaust plenum creates a flow of gases across each of the wafers arranged in wafer transport 20 from the gas panels to the exhaust plenums. To ensure uniform gas distribution across the surface of each wafer in transport 20, in one embodiment, the plurality of inlets 36 and gas exhausts 37 shown in FIG. 4 are arranged in vertical stacks equal in number to the number of wafers transport 20 is configured to hold. Thus, in an embodiment where transport 20 holds 30 wafers, there are 30 sets of gas inlets 36 and gas exhausts 37 spaced in each of batch processing areas 30 and 40 and positioned to create a uniform gas flow across the surface of a wafer located at a particular position on wafer transport 20.

As previously mentioned, embodiments of the invention are particularly well suited for performing an ozone cure operation. Wafers can be transferred directly from a film deposition or formation chamber (e.g., where a carbon doped oxide or other film that needs to be cured is deposited) to batch processing area 40. If wafers are transferred into processing area one wafer at a time every 90 seconds and transport 20 holds 30 wafers, it will take over 30 minutes to completely fill the transport. In some instances, outgassing may still occur shortly after film deposition, so processing area 40 may also serve as a holding area where the wafers sit until outgassing has stabilized to a point where the amount of outgassing from the last wafer transferred to transport 20 is very close or identical to the amount of outgassing from the first wafer that may have had a layer deposited over it 30 minutes prior to the last wafer. In other embodiments, wafers are held in a separate holding area to allow for the equalization of outgassing and then transferred into processing area 40.

Once the wafers are ready, transport 20 is then moved up to processing area 40 where plate 28 forms a pseudo seal with divider 14. The wafers may then be subject to an ozone cure process. In one embodiment, nitrogen is first introduced into area 40 to heat the wafers to a desired temperature of between 105-200 degrees Celsius. Then, ozone is introduced to perform an ozone cure at a pressure of between 200-700 Torr (in one particular embodiment at 600 Torr). When the cure step is completed, the wafer transport can be lowered back to processing area 30 and the wafers can be subject to a lower temperature steam anneal or other post cure treatment process or may be transferred out of chamber 10 to another chamber altogether.

Curing chamber 10 can be operatively coupled to a multichamber substrate processing system such as a Centura™ or Producer™ system manufactured by Applied Materials. In such a system, the access door 45 (e.g., a slit valve) may open to an interior chamber of the multichamber system. Wafers may be moved into and out of chamber 10 through access door 45 by a robot. FIG. 7 shows one example of such a system where chamber 10 can be integrated into one of the FOUPs (front opening unified pods) of the system. FOUPs 402 supply substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back. The processing chambers 408a-f may include one or more system components for depositing dielectric films on the substrate wafer or performing other substrate processing wafers within each of chamber 408a-f.

While not shown in any of FIGS. 1-5, some embodiments of the present invention include a gas inlet channel or tube within a portion of chamber wall 12 that is adapted to deliver a heated or cooled non-reactive gas (e.g., $N_2$) to areas surrounding dividers 14. The gas can be circulated within the chamber walls within channels in these areas to compensate for temperature non-uniformities when processes performed in areas 30 and 40 are done so at different temperatures. In such instances, a flow of this temperature control gas can be used, for example, to cool an upper portion of the lower chamber so the temperature of the upper portion of the chamber in processing area 40 more closely matches the temperature of the lower portion of the chamber in processing area 40.

After processing one or more batches of wafers in chamber 10, the chamber can be cleaned by flowing activated fluorine radicals generated in remote plasma system 50 into the chamber 10. Wafer transport 20 is generally placed in an intermediary position such neither top isolation plate 26 or bottom isolation plate 28 is in contact with divider 14 during the clean phase. In such a position an upper portion of the wafer transport is in processing area 30 while a lower portion of the transport is in processing area 40 and clean gases flow freely from area 30 around top plate 26 into area 40 to effect cleaning in both the upper and lower portions of chamber 10.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursor and equivalents thereof known to those skilled in the art, and so forth. Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A substrate curing chamber for processing a plurality of wafers in batch mode, the chamber comprising:
   a vertically aligned housing having first and second processing areas separated by an internal divider, the first processing area positioned directly over the second processing area;
   a multi-zone heater operatively coupled to the housing to heat the first and second processing areas independent of each other;
   a wafer transport adapted to hold a plurality of wafers within either the first or second processing area for processing;
   a first gas distribution system adapted to introduce a process gas through the first processing area and a second gas distribution system adapted to introduce a process gas through the second processing area;
   a gas exhaust system configured to exhaust process gases introduced into the first and second processing areas;
   a pedestal, operatively coupled to the wafer transport, to move the wafer transport into an upper position in which the plurality of wafers are positioned in the second processing area and a lower position in which the plurality of wafers are positioned in the first processing area; and
   an access door that can be moved between an open position in which wafers can be loaded onto and removed from the wafer transport and a closed sealed position;
   wherein the wafer transport includes top and bottom isolation plates that can be moved in contact with the divider to minimize fluid communication between the first and second processing areas during substrate processing.

2. The substrate curing chamber set forth in claim 1 further comprising a remote plasma system operatively coupled to introduce activated cleaning species into the curing chamber.

3. The substrate curing chamber set forth in claim 1 wherein the pedestal is operatively coupled to rotate the wafer transport during substrate processing.

4. The substrate curing chamber set forth in claim 1 wherein the wafer transport holds a plurality of wafers, each in a successive horizontal position supported on support posts arranged around an outer periphery of the respective wafer.

5. The substrate curing chamber set forth in claim 1 wherein the first gas distribution system is configured to introduce steam and perform a steam anneal in the first processing area and the second gas distribution is configured to introduce ozone and perform an ozone cure in the second processing area.

6. The substrate curing chamber set forth in claim 1 further comprising one or more dedicated gas inlets to introduce a temperature control gas at a location near a boarder of the first and second processing areas.

7. The substrate curing chamber set forth in claim 1 wherein the wafer transport holds thirty wafers stacked vertically within the transport.

8. The substrate curing chamber set forth in claim 1 wherein the second gas distribution system comprises a plurality of gas inlets arranged around a portion of the inner circumference of the chamber and the gas exhaust system comprises a plurality of gas exhaust outlets arranged around a portion of the inner circumference of the chamber opposite the plurality of gas inlets.

9. The substrate curing chamber set forth in claim 1 wherein the wafer transport holds the plurality of wafers in a plurality of vertically aligned wafer positions within the transport and for each wafer position, the second gas distribution system comprises a plurality of gas inlets arranged around a portion of the inner circumference of the chamber at a location aligned with a corresponding wafer position and the gas exhaust system comprises a plurality of gas exhaust outlets arranged around a portion of the inner circumference of the chamber opposite the plurality of gas inlets aligned with the corresponding wafer position.

10. The substrate curing chamber set forth in claim 1 wherein the access door is operatively coupled to the chamber in the first processing area.

* * * * *